US012575341B2

(12) United States Patent
Krüger et al.

(10) Patent No.: US 12,575,341 B2
(45) Date of Patent: Mar. 10, 2026

(54) METHOD FOR ANNEALING BONDING WAFERS

(71) Applicant: IHP GmbH—Innovations for High Performance Microelectronics / Leibniz-Institut fur Innovative Mikroelektronik, Frankfurt (DE)

(72) Inventors: Patrick Krüger, Frankfurt (DE); Thomas Voss, Frankfurt (DE); Matthias Wietstruck, Frankfurt (DE)

(73) Assignee: IHP GMBH—INNOVATIONS FOR HIGH PERFORMANCE MICROELECTRONICS / LEIBNIZ-INSTITUT FUR INNOVATIVE MIKRO, Frankfurt (DE)

( * ) Notice: Subject to any disclaimer, the term of this patent is extended or adjusted under 35 U.S.C. 154(b) by 679 days.

(21) Appl. No.: 17/874,742

(22) Filed: Jul. 27, 2022

(65) Prior Publication Data

US 2023/0030354 A1 Feb. 2, 2023

(30) Foreign Application Priority Data

Jul. 27, 2021 (EP) .................................... 21187959

(51) Int. Cl.
| | |
|---|---|
| *H01L 21/18* | (2006.01) |
| *H01L 21/20* | (2006.01) |
| *H01L 21/324* | (2006.01) |

(52) U.S. Cl.
CPC ........ *H01L 21/187* (2013.01); *H01L 21/2007* (2013.01); *H01L 21/324* (2013.01)

(58) Field of Classification Search
CPC .. H01L 21/187; H01L 21/2007; H01L 21/324
See application file for complete search history.

(56) References Cited

U.S. PATENT DOCUMENTS 6,833,195 B1 * 12/2004 Lei .................... H01L 21/76254
257/E21.321
10,229,897 B2 3/2019 Das
(Continued)

FOREIGN PATENT DOCUMENTS

| EP | 1429381 A2 | 6/2004 | |
|---|---|---|---|
| EP | 2238614 B1 * | 3/2020 | ............. H01L 21/02 |

OTHER PUBLICATIONS

EP Search Report dated Jan. 17, 2022 issued by the EPO in corresponding Application No. EP21187959, 8 pages.
(Continued)

*Primary Examiner* — Joseph C. Nicely
(74) *Attorney, Agent, or Firm* — Francis J. Maguire; WARE FRESSOLA MAGUIRE & BARBER LLP

(57) ABSTRACT

The invention relates to a method for annealing of at least two wafers bonded via low-temperature direct bonding comprising heating the bonded wafers up to a first annealing temperature in the range of 100° C. to 500° C., preferably 150° C. to 400° C., even more preferred 150° C. to 200° C., holding the first annealing temperature in a range of 1 to 4 hours, preferably 1 to 3 hours, cooling down the bonded wafers to room temperature, re-heating the bonded wafers to a second annealing temperature in the range of 100° C. to 500° C., preferably 150° C. to 400° C., even more preferred 150° C. to 200° C., and cooling down the bonded wafers to room temperature.

12 Claims, 3 Drawing Sheets

(56) References Cited

U.S. PATENT DOCUMENTS

| | | | |
|---|---|---|---|
| 10,510,576 B2 | 12/2019 | Enicks et al. | |
| 2002/0098713 A1* | 7/2002 | Henley | C23C 16/54 |
| | | | 700/121 |
| 2004/0053515 A1* | 3/2004 | Comita | C30B 33/00 |
| | | | 257/E21.119 |
| 2004/0132304 A1 | 7/2004 | Farrens et al. | |
| 2004/0152282 A1 | 8/2004 | Tong et al. | |
| 2004/0161904 A1* | 8/2004 | Berne | H01L 21/76254 |
| | | | 438/455 |
| 2006/0043483 A1* | 3/2006 | Shaheen | H01L 21/306 |
| | | | 438/455 |

OTHER PUBLICATIONS

Krüger et al.: "Entwicklung einer Scherkraftmessung zur qualitativen Analyse und Optimierung von Wafer Bonding Prozessen", Proc. 8. MikroSystemTechnik Kongress (MST 2019), 722 (2019), 4 pages.
Ploszl et al.: "Wafer direct bonding: tailoring adhesion between brittle materials", Materials Science and Engineering: R: Reports, Elsevier, Amsterdam, NL, vol. 25, No. 1-2, Mar. 10, 1999, pp. 1-88.

* cited by examiner

METHOD FOR ANNEALING BONDING WAFERS

CROSS-REFERENCE TO RELATED APPLICATION

This application claims priority under 35 USC § 119 to European Patent Application No. 21187959.8 filed on Jul. 27, 2021, which is hereby incorporated by reference in its entirety.

TECHNICAL FIELD

The invention relates to a method for annealing at least two bonded wafers bonded via low-temperature bonding, a computer program, a computer readable medium, a heating control unit and a heating device.

BACKGROUND OF THE INVENTION

Wafers can be bonded using direct bonding without any additional intermediate layers using pre-processing and annealing at high temperatures, typically above 800° C. Even though direct bonding is highly flexible in processing numerous materials, the mismatch of CTE (coefficient of thermal expansion) using different materials is a substantial restriction for wafer level bonding, especially the high annealing temperatures of direct bonding. Lower annealing temperatures are important for bonding pre-processed wafers or compound materials to avoid undesirable changes or decomposition. The reduction of the required annealing temperature can be achieved by different pre-treatments such as for example plasma activated bonding processes or surface activated bonding processes.

Also for wafers bonded via low-temperature bonding an annealing step during which the wafers are heated to an elevated temperature is used and necessary to improve the bonding forces between the wafers. The annealing takes place for several hours at the elevated temperature. While improving the bonding and reducing the undesired thermal impact and decomposition compared to conventional direct bonding processes also the known low-temperature bonding processes can lead to thermal stress and decomposition. Thus further improvement is needed.

SUMMARY OF THE INVENTION

It is an object of the invention to improve the annealing process for low-temperature direct bonded wafers by reducing the thermal impact on the wafers while achieving high quality bonding.

According to a first aspect of the invention, the object is achieved by a method for annealing of at least two wafers bonded via low-temperature direct bonding comprising the following steps:

heating the bonded wafers up to a first annealing temperature in the range of 100° C. to 500° C.,
   holding the first annealing temperature in a range of 1 to 4 hours,
   cooling down the bonded wafers to room temperature,
   re-heating the bonded wafers to a second annealing temperature in the range of 100° C. to 500° C., and
   cooling down the bonded wafers to room temperature.

The invention is based on the surprising recognition that with using at least two thermal cycles during the annealing the overall annealing time and especially holding periods on the elevated temperature can be significantly reduced, while the bonding forces are at the same or higher level than with conventional low-temperature direct bonding. Thus the invention allows for reduced thermal impact and thus reduced problems with decomposition or other diffusion problems occurring during holding on elevated temperatures while achieving high bonding forces. Furthermore, the annealing process is significantly shortened and thus improved economically and ecologically.

The first and/or second annealing temperature is preferably in the range of 150° C. to 400° C., even more preferred 150° C. to 200° C. The holding time for the first annealing temperature is preferably in the range of 1 to 3 hours, In the following further embodiments of the method are described, which can be combined if not described as alternatives.

According to an embodiment of the method, the method further comprises the steps of:

re-heating the bonded wafers to a third annealing temperature in the range of 100° C. to 500° C., preferably 150° C. to 400° C., even more preferred 150° C. to 200° C., and
   cooling down the bonded wafers to room temperature.

Also, a fourth or further annealing cycle corresponding to the third cycle is possible, while more than two cycles are especially relevant and useful in the lower temperature ranges and/or with shorter holding times in the first cycle. The use of a third or further cycle can be helpful to further improve the bonding while reducing the overall annealing time.

According to an embodiment of the method, the method further comprises the step of holding the second and/or third annealing temperature in a range of 2 minutes to 1 hours, preferably 10 minutes to 20 minutes before cooling down the bonded wafers to room temperature. While it can be sufficient to only re-heat to the second or third annealing temperature without a holding step, it can be helpful to hold the second and/or third annealing temperature for a certain time in order to improve the bonding.

According to a further embodiment the second and/or third annealing temperature is the same temperature as the first annealing temperature or is higher or lower than the first annealing temperature within a range of +/−50° C.

According to a further embodiment heating to the first and/or second and/or third annealing temperature takes place with a rate of at least 50 K/min. Preferably, cooling down after the first and/or second and/or third annealing temperature takes place with a rate of at least 50 K/min. Higher heating and cooling rates can be preferred in order to avoid diffusion processes in the wafers during heating and to shorten the overall annealing time. On the other hand especially during cooling down rates should not be too high to avoid excessive thermal stress. Preferably the cooling rate is lower than the heating rate.

In an embodiment the low-temperature direct bonding is a plasma activated bonding process, a surface activated bonding process, a bonding process under ultra-high vacuum (UHV), a bonding process using a surface activation by chemical-mechanical polishing (CMP) or a bonding process using a surface treatment to achieve chemical activation in hydrolysed tetraalkoxysilanes $Si(OR)_4$, hydrolyzed tetramethoxysilane $Si(OCH_3)_4$ or nitride acid $HNO_3$.

The treatment of the wafers before annealing comprises for example the following steps, the wafer surfaces are cleaned and polished, then activated—for example using an oxygen or nitrogen plasma in case of a plasma activated process—, cleaned using deionized water, oriented towards each other and placed in a bonding chamber. In the bonding chamber the pressure can be reduced to under $10^{-4}$ mbar, but bonding under atmosphere pressure is also possible. In the bonding chamber the wafers are put together and pressed using for example a stamp. For the subsequent annealing the wafers are normally removed from the bonding chamber.

Preferably at least one of the wafers comprises silicon, a metal oxide, especially lithium tantalate ($LiTaO_3$), a metalloid oxide, especially silicon dioxide or is a glass substrate. The bonding interface is normally an oxide-oxide interface for these materials. Especially a silicon dioxide—silicon dioxide interface for silicon wafers.

Preferably the steps of heating and or re-heating are performed using a heat plate, a furnace or a heating lamp. All these heating elements allow for relatively high heating and cooling rates.

According to a second aspect the invention relates to a computer program comprising program code means for performing the steps of any of the embodiments of the method according to the first aspect of the invention when said program is run on a computer connected to a heating device.

According to a third aspect the invention relates to a computer readable medium carrying a computer program comprising program code means for performing the steps of any of the embodiments of the method according to the first aspect of the invention when said program product is run on a computer connected to a heating device.

According to a fourth aspect the invention relates to a heating control unit for controlling a heating device, wherein the control unit is configured to prompt the heating device to perform the steps of the method according to the first aspect of the invention.

According to a fifth aspect the invention relates to a heating device with a control unit for controlling the heating device according to the fifth aspect of the invention.

Possible embodiments and advantages, which are described in view of the method according to the first aspect of the invention, also relate to the computer program, the computer readable medium, the heating control unit and the heating device. Further advantages and advantageous features of the invention are disclosed in the following description and in the dependent claims.

Preferred embodiments of the invention are described in the following as examples.

DETAILED DESCRIPTION

Figure 1:
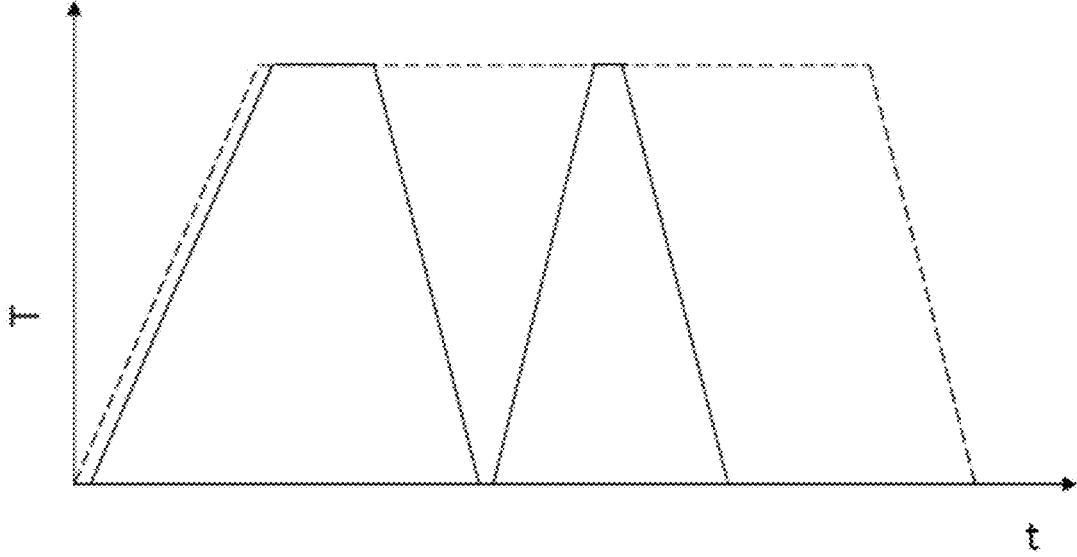
FIG. 1 is a schematic temperature diagram of an example embodiment of a method for annealing according to the first aspect of the invention.

FIG. 1 shows a schematic temperature diagram of an example embodiment of a method for annealing according to the first aspect of the invention in comparison to a conventional annealing process. The conventional annealing process (dotted curve) comprises the steps of heating to the annealing temperature, holding the annealing temperature and subsequent cooling down. In contrast the method according to the first aspect of the invention (solid line)

comprises the step of heating the bonded wafers up to a first annealing temperature, holding the first annealing temperature for a time span significantly shorter than the holding time span of the conventional process. Then cooling down the bonded wafers back to room temperature, subsequent re-heating the bonded wafers to a second annealing temperature in the range of the first annealing temperature and in the shown example holding the second annealing temperature for a second time span before cooling down the bonded wafers to room temperature. The overall annealing time is thus significantly shorter for the method according to the invention while comparable or improved bonding strength is achieved.

Figure 2:
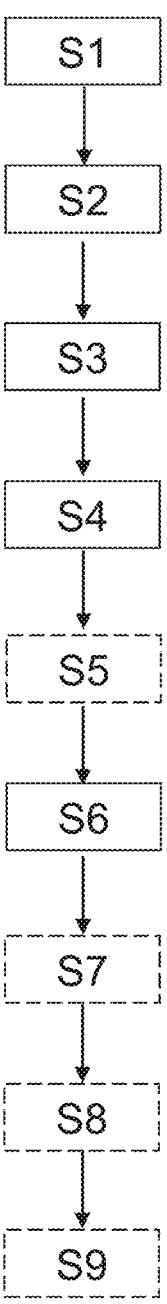
FIG. 2 is a schematic block diagram depicting steps in an example embodiment of a method for annealing according to the first aspect of the invention.

FIG. 2 shows a schematic block diagram depicting steps in an example embodiment of a method for annealing according to the first aspect of the invention. The depicted method for annealing of at least two wafers bonded via low-temperature direct bonding comprises as step S1 heating the bonded wafers up to a first annealing temperature in the range of 100° C. to 500° C. Preferably the first annealing temperature is in a range of 150° C. to 400° C., even more preferred 150° C. to 200° C. Thus it is possible to also have annealing temperatures lower than in common processes. This first annealing temperature is than hold in a range of 1 to 4 hours, preferably 1 to 3 hours in step S2 before cooling down the bonded wafers to room temperature in step S3. In step S4 the bonded wafers are re-heated to a second annealing temperature, which is also in the range of 100° C. to 500° C., preferably 150° C. to 400° C., even more preferred 150° C. to 200° C. The second annealing temperature is the same temperature as the first annealing temperature. Alternatively the second annealing temperature can also be higher or lower than the first annealing temperature within a range of +1-50° C.

In an optional step S5 the second annealing temperature is held in a range of 2 minutes to 1 hours, preferably 10 minutes to 20 minutes before cooling down the bonded wafers to room temperature in step S6. Optionally in step 7 a further re-heating of the bonded wafers to a third annealing temperature takes place. Preferred temperature ranges for the third annealing temperature are the range of 100° C. to 500° C., preferably 150° C. to 400° C., even more preferred 150° C. to 200° C.

The third annealing temperature is preferably the same temperature as the first annealing temperature or is higher or lower than the first annealing temperature within a range of +/−50° C. In a further optional step S8 the third annealing temperature is held in a range of 2 minutes to 1 hours, preferably 10 minutes to 20 minutes before cooling down the bonded wafers to room temperature in step S9.

The effects of the second or third thermal cycle are described in the following in view of FIG. 3.

Figure 3:
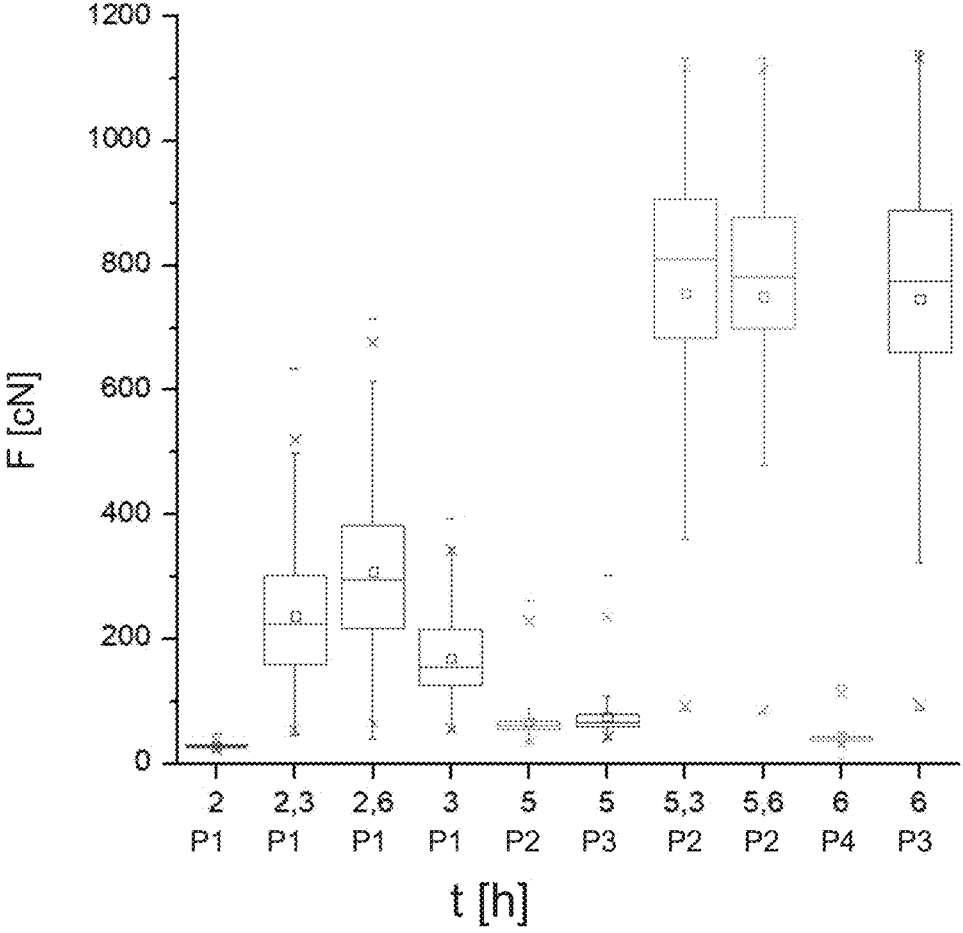
FIG. 3 shows shear forces for some exemplary embodiments of a method according for annealing according to the first aspect of the invention.

FIG. 3 shows shear forces for some exemplary embodiments of a method for annealing according to the first aspect of the invention. In FIG. 3 shear forces for four different wafer pairs after different annealing times are shown. The used wafers are silicon wafers. The given annealing time is the overall holding time at annealing temperature for the pair, i.e. cumulated annealing times. For all shown pairs the first, second, third and fourth annealing temperatures (where applicable) was 200° C. This means the holding times are added up where more than one thermal cycle is used.

The shown shear forces correlate to the shear strength, when normalized to the surface. The shear force, respectively the shear strength is a measure for the bonding quality, the higher the measured shear force the higher the strength of the bonding. The measurement method is for example described in "Entwicklung einer Scherkraftmessung zur qualitativen Analyse and Optimierung von Wafer Bonding Prozessen P. Krüger et. al Proc. 8. MikroSystemTechnik Kongress (MST 2019), 722 (2019)". The bonding quality is determined via shear force measuring in order to have more measuring points per wafer and to be able to perform serial examinations.

The measurements are performed using wafers structured with a wafer saw. A grid is sawn in the surface. The resulting structures have an edge length of 200×200 μm². After this preparation the bonding process, here a plasma activated bonding process, took place. After annealing the structures are exposed by polishing the back of the structured wafer to a silicon thickness of 100 μm. The shear forces are then measured using the structures with standard bond tester.

Wafer pair P1 was heated to the first annealing temperature and then held for two hours. After cooling down P1 was re-heated to the second annealing temperature, which was the same as the first annealing temperature and held for 18 minutes. As can be seen the bonding force achieved after the cumulated annealing time of 2.3 hours is a multiple of the bonding force achieved after 2 hours. A third thermal cycle (2.6 hours) with re-heating to a third annealing temperature equal to the first annealing temperature brings a further but slight improvement while in the shown case a fourth thermal cycle (3 hours) as no positive effect on the bonding force.

Wafer pair P2 was heated to the first annealing temperature and then held for five hours. Compared to wafer pair P1 the bonding forces after 5 hours of holding, which corresponds to a conventional annealing process, are significantly lower than after the two (or more) thermal cycles, with which wafer pair P1 was treated.

Thus the thermal cycling leads to improved bonding forces in shorter overall annealing time. Subsequently also wafer pair P2 was re-heated once (5.3 hours) and twice (5.6 hours), which also shows significant improvements in bonding forces compared to only one thermal cycle (5 hours P2) and also an improvement in comparison to wafer pair P1 with shorter cumulated annealing time.

Wafer pair P3 was also to the first annealing temperature and then held for five hours. Subsequently wafer pair P3 was re-heated to a second annealing temperature equal to the first annealing temperature and held for 1 hour. To compare the effect of the second thermal cycle with an annealing process having only one cycle but the same cumulated annealing time on the elevated temperature a wafer pair P4 was held for 6 hours on the first annealing temperature. It can be seen that due to the second thermal cycle wafer pair P3 shows a considerable improvement in bonding force compared to wafer pair P4. Thus the re-heating to a second annealing temperature according to the invention leads to significantly improved bonded wafers in shorter time.

What is claimed is:

1. A method for annealing of at least two wafers bonded via low-temperature direct bonding comprising the following steps:

heating the bonded wafers up to a first annealing temperature in the range of 100° C. to 500° C., holding the first annealing temperature in a range of 1 to 4 hours, cooling down the bonded wafers to room temperature, re-heating the bonded wafers to a second annealing temperature in the range of 150° C. to 200° C., cooling down the bonded wafers to room temperature, re-heating the bonded wafers to a third annealing temperature in the range of 100° C. to 500° C., and cooling down the bonded wafers to room temperature.

2. The method according to claim 1, further comprising the step of holding the second and/or third annealing temperature in a range of 2 minutes to 1 hours, before cooling down the bonded wafers to room temperature.

3. The method according to claim 2, wherein the second and/or third annealing temperature is the same temperature as the first annealing temperature or is higher or lower than the first annealing temperature within a range of +/−50° C.

4. The method according to claim 3, wherein heating to the first and/or second and/or third annealing temperature takes place with a rate of at least 50 K/min.

5. The method according to claim 4, wherein cooling down after the first and/or second and/or third annealing temperature takes place with a rate of at least 50 K/min.

6. The method according to claim 5, wherein the low-temperature direct bonding is a plasma activated bonding process, a surface activated bonding process, a bonding process under ultra-high vacuum (UHV), a bonding process using a surface activation by chemical-mechanical polishing (CMP) or a bonding process using a surface treatment to achieve chemical activation in hydrolysed tetraalkoxysilanes $Si(OR)_4$, hydrolysed tetramethoxysilane $Si(OCH_3)_4$ or nitride acid $HNO_3$.

7. The method according to claim 6, wherein at least one of the wafers comprises silicon, a metal oxide, a metalloid oxide, or is a glass substrate.

8. The method according to claim 7, wherein the steps of heating and/or re-heating are performed using a heat plate, a furnace or a heating lamp.

9. The method according to claim 1, further comprising the step of holding the second and/or third annealing temperature in a range of 2 minutes to 1 hours before cooling down the bonded wafers to room temperature.

10. The method according to claim 1, wherein the second and/or third annealing temperature is the same temperature as the first annealing temperature or is higher or lower than the first annealing temperature within a range of +/−50° C.

11. The method according to claim 1, wherein heating to the first and/or second and/or third annealing temperature takes place with a rate of at least 50 K/min.

12. The method according to claim 1, wherein cooling down after the first and/or second and/or third annealing temperature takes place with a rate of at least 50 K/min.

* * * * *